United States Patent [19]

Matsumoto et al.

[11] Patent Number: 4,469,776
[45] Date of Patent: Sep. 4, 1984

[54] DEVELOPING SOLUTION FOR LIGHT-SENSITIVE PRINTING PLATES

[75] Inventors: Hiroshi Matsumoto; Nobuyuki Kita, both of Shizuoka, Japan

[73] Assignee: Fuji Photo Film Co., Ltd., Kanagawa, Japan

[21] Appl. No.: 489,906

[22] Filed: Apr. 29, 1983

[30] Foreign Application Priority Data

Apr. 30, 1982 [JP] Japan ................................. 57-72913

[51] Int. Cl.³ ............................ G03F 7/08; G03C 5/24
[52] U.S. Cl. ..................................... 430/309; 430/193; 430/331
[58] Field of Search ....................... 430/331, 193, 309

[56] References Cited

U.S. PATENT DOCUMENTS

| | | | |
|---|---|---|---|
| 3,201,241 | 8/1965 | Munder et al. | 430/331 |
| 3,475,171 | 10/1969 | Alles | 430/331 |
| 3,615,480 | 10/1971 | Lam | 430/331 |
| 4,093,464 | 6/1978 | Ruckert et al. | 430/193 |
| 4,123,279 | 10/1978 | Kobayashi | 430/192 |
| 4,259,434 | 3/1981 | Yamasue et al. | 430/141 |
| 4,314,022 | 2/1982 | Fisch | 430/331 |
| 4,374,920 | 2/1983 | Wanat et al. | 430/331 |

Primary Examiner—Mary F. Downey
Attorney, Agent, or Firm—Sughrue, Mion, Zinn, Macpeak and Seas

[57] ABSTRACT

A developing solution for a light-sensitive printing plate having an o-quinonediazide-containing light-sensitive layer is disclosed. The developing solution is comprized of an aqueous solution of alkali silicate and a chelating agent. By including the chelating agent within the developing solution it is possible to carry out development utilizing water which contains typical impurities such as insoluble calcium silicate or magnesium silicate for a long period of time which substantially has no formation of insoluble matter within the developing machine. Use of the developing solution substantially eliminate the formation of any deposit within the spraying pipes and nozzles of the developing machine which it is used in connection with.

4 Claims, No Drawings

DEVELOPING SOLUTION FOR LIGHT-SENSITIVE PRINTING PLATES

FIELD OF THE INVENTION

The present invention relates to an improved developing solution for light-sensitive printing plates having a light-sensitive layer containing an o-quinone-diazide compound.

BACKGROUND OF THE INVENTION o-Quinonediazide compounds are known to undergo decomposition of the diazo group by irradiation with actinic light to form compounds having a carboxyl group. Thus, when imagewise exposed and developed with an alkaline aqueous developing solution, exposed areas of a light-sensitive layer containing an o-quinonediazide compound are removed, and the non-exposed areas are left to form an image. Therefore, such a light-sensitive layer has recently been frequently used as a so-called positive working light-sensitive component of a light-sensitive printing plate or so-called presensitized plate. Particularly, a light-sensitive layer comprising an o-quinonediazide compound mixed with an alkaline aqueous solution-soluble resin has been advantageously used from the practical point of view. Light-sensitive layers comprising an o-quinonediazide compound mixed with a novolak type phenol-formaldehyde condensate resin or a cresol-formaldehyde condensate resin are the most popular light-sensitive compositions used in the art. Useful developing solutions for light-sensitive layers containing these o-quinonediazide compounds include aqueous solutions containing sodium tertiary phosphate, sodium hydroxide, potassium hydroxide, sodium silicate, potassium silicate, ammonium silicate, etc., alone or in combination. However, an aqueous solution containing only sodium tertiary phosphate, sodium hydroxide or potassium hydroxide is not desirably used for developing a light-sensitive printing plate comprising an aluminum support because its aluminum-etching ability is too strong. In addition, they undergo serious deterioration of developing ability after repeated use, and a definite volume of the solution has an extremely small throughput capacity for processing light-sensitive printing plates.

Accordingly, the use of an alkali silicate aqueous solution has recently become popular because it shows a moderate etching action on aluminum and makes it possible to adjust the developing ability within some range by controlling the ratio of silicon oxide ($SiO_2$) to alkali oxide ($M_2O$) (generally presented as a molar ratio of $SiO_2/M_2O$) and the concentration thereof. That is, as the content of the $SiO_2$ increases, the developing ability is depressed with development stability being increased, whereas as the content of the $M_2O$ increases, the developing ability is raised, with development stability being lowered. The phrase "development stability" as used herein means image stability against variation of developing time, and if the amount of $M_2O$ only is increased, the image area which should reside on a support tends to be removed in a short time.

On the other hand, a developing solution comprising the alkali silicate aqueous solution is usually used by diluting a concentrated composition with city water or well water. In this occasion, particularly, when development processing with such the diluted developing solution is continuously conducted for a long time using an automatic developing machine, insoluble matter accumulates on the bottom of the tank in the developing machine or deposits in spraying pipes or nozzles, leading to abnormal function of the machine.

SUMMARY OF THE INVENTION

Accordingly, an object of the present invention is to provide a developing solution for light-sensitive printing plates having an o-quinonediazide-containing light-sensitive layer, which solution removes the above-described defects and which comprises an alkali silicate aqueous solution.

As a result of intensive investigations on the above-described points, the inventors have found that calcium ion or magnesium ions contained in the diluting city water or well water gradually react with the alkali silicate to produce insoluble matter, thereby causing the above problems, and have found that a developing solution free of the above-described problems can be obtained by adding a chelating agent to the alkali silicate aqueous solution.

DETAILED DESCRIPTION OF THE INVENTION

Useful alkali silicates used in the present invention include sodium silicate, potassium silicate and ammonium silicate. The molar ratio of silicon oxide to alkali oxide in the alkali silicate, i.e., $SiO_2/M_2O$ (M: monovalent alkali) is suitably 1:1 to 2.0:1, and the concentration of alkali silicate in the developing solution upon use is desirably 2 to 20 wt%.

The concentration of alkali silicate and the molar ratio of $SiO_2/M_2O$ vary depending upon the alkali solution solubility of o-quinonediazide-containing light-sensitive layer, development stabilizers optionally added to the developing solution for stabilizing development, and other optional additives. A preferable alkali silicate is potassium silicate, the molar ratio of $SiO_2/K_2O$ being 1.0 to 2.0 and the concentration of potassium silicate in the developing solution ranging from 2 to 10 wt%. Other specific alkali silicate aqueous solutions used in the present invention include an alkaline aqueous solution described in Japanese Patent Application (OPI) No. 51324/75 (the term "OPI" as used herein refers to a "published unexamined Japanese patent application") which contains a surfactant added thereto, an alkaline aqueous solution described in Japanese Patent Application (OPI) No. 1425528/81 which contains a water-soluble amphoteric high molecular electrolyte, an alkaline aqueous solution described in Japanese Patent Application (OPI) No. 95946/80 which contains a water-soluble cationic polymer added thereto, an alkaline aqueous solution described in Japanese Patent Application (OPI) No. 91221/74 which contains benzyl alcohol, an alkaline aqueous solution described in Japanese Patent Application (OPI) No. 25100/80 which contains an ionizable compound of an element of Group IIa, IIIa or IIIb in the Periodic Table, an aqueous solution described in U.S. Pat. No. 4,259,434 in which M in $SiO_2/M_2O$ is at least 20%, and the like.

The chelating agent to be added to the alkali silicate aqueous solution is alkaline aqueous solution-soluble and shows a calcium ion-masking ratio of 50% or more in an aqueous solution having a pH of 12 or more. Preferable chelating agents include aminopolycarboxylic acids such as ethylenediaminetetraacetic acid and its potassium or sodium salt; diethylenetriaminepentaacetic acid and its potassium or sodium salt; triethylenetetraminehexaacetic acid and its potassium or sodium salt; hydroxyethylethylenediaminetriacetic acid and its potassium or sodium salt; nitrilotriacetic acid and its potassium or sodium salt; 1,2-diaminocyclohexanetetraacetic acid and its potassium or sodium salt; 1,3-diamino-2-propanoltetraacetic acid and its potassium or sodium salt; and like, and organic phosphonic acids or phosphonotricarboxylic acids such as 2-phosphonobutanetricarboxylic acid-1,2,4 and its potassium or sodium salt, 2-phosphonobutanetricarboxylic acid-2,3,4 and its potassium or sodium salt, 1-phosphonoethanetricarboxylic acid-1,2,2 and its potassium or sodium salt, 1-hydroxyethane-1,1-diphosphonic acid and its potassium or sodium salt, aminotri(methylenephosphonic acid) and its potassium or sodium salt, and the like. Organic amine salts of the above-described chelating agents are also effective as well as the above-described sodium or potassium salts. These chelating agents stably exist in the alkali silicate aqueous solution and do not inhibit development. They are added to the alkali silicate aqueous solution in amounts of 0.01 to 1 wt%, preferably 0.02 to 0.1 wt%.

The o-quinonediazide-containing light-sensitive layer to which the developing solution of the present invention is applied is a light-sensitive copying layer containing as a light-sensitive ingredient an o-quinonediazide compound which shows an increased solubility in an alkaline aqueous solution when irradiated with actinic light. Useful light-sensitive copying layers include those which independently contain o-quinonediazide compounds alone or in combination with an alkaline solution-soluble resin as described in U.S. Pat. No. 4,259,434, col. 3, line 2 up to col. 6, line 14. Particularly preferable light-sensitive layers comprise a mixture of an o-quinonediazide-sulfonic acid ester of an aromatic polyhydroxy compound with an alkali solution-soluble resin (e.g., phenol resin, cresol resin, styrene/maleic anhydride copolymer, etc.). The base plate used for coating the light-sensitive copying layer to prepare a printing plate may be an aluminum plate rendered hydrophilic as described in U.S. Pat. No. 4,259,434, col. 4, lines 2 to 38.

The use of the developing solution of the present invention for light-sensitive printing plates having an o-quinonediazide-containing light-sensitive layer reduces production of insoluble matter in automatic developing machines. Accordingly, use of the solution aids in eliminating abnormal functions of the machines due to deposition of insoluble matter in the spraying pipes and nozzles of the machines. Further, the developing solution of the present invention can be properly used without adversely affecting developing properties.

The developing solution of the present invention is supplied as a directly usable solution or as a concentrated solution of up to a 20-fold concentration so long as the ingredients do not precipitate. The concentrated solution is diluted, upon use, with city water or well water.

The present invention will now be described in more detail by the following non-limiting examples of preferred embodiments of the present invention. Additionally, "%" are all by weight.

EXAMPLE 1

0.85 Part by weight of naphthoquinone-1,2-diazide-5-sulfonic acid ester of polyhydroxyphenyl compound obtained by polycondensation of acetone and pyrogallol, described in Example of U.S. Pat. No. 3,635,709, 2.25 parts by weight of cresol-formaldehyde resin, 0.05 part by weight of p-octylphenol-formaldehyde resin, 0.04 part by weight of naphthoquinone-1,2-diazide-4-sulfonyl chloride, 0.03 part by weight of p-toluenesulfonic acid salt of Crystal Violet, and 0.15 part by weight of tetrahydrophthalic anhydride were dissolved in 20 parts by weight of 2-methoxyethyl acetate and 20 parts by weight of methyl ethyl ketone to prepare a light-sensitive solution.

A 0.3-mm thick, grained aluminum plate was anodized in sulfuric acid to form thereon an oxide film of about 3 g/m$^2$, well washed with water, and dried. Then, the above-described light-sensitive solution was coated thereon and dried to obtain a light-sensitive printing plate having a light-sensitive layer present in an amount of about 2.5 g/m$^2$. 21 Liters of a developing solution prepared by diluting the following concentrated developing solution 14 times (by volume; hereinafter the same) with well water containing about 20 ppm calcium ion was charged in the tank of an automatic developing machine described in FIG. 2 of U.S. Pat. No. 4,259,434.

Concentrated Developing Solution

Potassium silicate (SiO$_2$/K$_2$O=2.0 mol% aqueous solution): 70.0 kg
50% Potassium hydroxide aqueous solution: 29.0 kg
Sodium nitrilotriacetate: 0.3 kg
Ion-exchanged water: 38.5 kg The imagewise exposed light-sensitive plates described above were continuously processed at a rate of 200 m$^2$/day for 20 days. The activity of the solution was always kept at the same level as that of the initial solution by adding thereto, in the course of the processing, a replenisher prepared by diluting the above-described concentrated developing solution 6 times with well water containing about 20 ppm calcium ion. As a result, the automatic developing machine normally functioned during the 20-day processing without clogging of a spray nozzle. After processing for 20 days, formation of insoluble matter was examined by removing the developing solution to find almost no insoluble matter being formed. For comparison, precisely the same 20-day processing as described above was conducted using the same concentrated developing solution as described above except for omitting sodium nitrilotriacetate. As a result, clogging of the spray nozzle occurred on the 12th day. When the developing solution was removed after the 20-day processing to examine formation of insoluble matter, much insoluble matter was deposited on the spray pipe. Thus, it was found that formation of insoluble matter can be depressed by using developing solution containing sodium nitrilotriacetate.

EXAMPLE 2

21 Liters of a developing solution prepared by diluting 7 times the following concentrated developing solution with the same well water as used in Example 1 was charged in the same automatic developing machine as used in Example 1.

Concentrated Developing Solution

Sodium silicate (SiO$_2$/Na$_2$O molar ratio=3.0, 40% aqueous solution): 50 kg
50% Potassium hydroxide aqueous solution: 27 kg
50% Aqueous solution of 2-phosphonobutanetricarboxylic acid-1,2,3 potassium salt: 0.5 kg
Ion-exchanged water: 76 kg The exposed light-sensitive printing plates used in Example 1 were continuously processed at a rate of 50 m²/day for 14 days. A replenisher prepared by diluting 3 times the above-described concentrated solution was added thereto in the course of the processing for restoring the activity of the developing solution. After 14 days of processing, the developing solution was removed to examine it for the formation of insoluble matter in the machine. Upon examination, almost no insoluble matter was found.

EXAMPLE 3

Sodium ethylenediaminetetraacetate was used in place of sodium nitrilotriacetate in the formulation of the concentrated developing solution described in Example 1. This concentrated developing solution was diluted 14 times with the same well water as used in Example 1, and 21 liters of the solution was charged in the same automatic developing machine as used in Example 1. The exposed light-sensitive printing plates used in Example 1 were continuously processed for 14 days at a rate of 50 m²/day. A replenisher prepared by diluting 6 times the above-described concentrated solution was added thereto in the course of the processing for restoring the activity of the developing solution. After 14 days of processing, the developing solution was removed to examine it for the formation of insoluble matter in the machine. Upon examination, almost no insoluble matter was found.

While the invention has been described in detail and with reference to specific embodiments thereof, it will be apparent to one skilled in the art that various changes and modifications can be made therein without departing from the spirit and scope thereof.

What is claimed is:

1. A method of developing an imagewise exposed light-sensitive presensitized printing plate having a light-sensitive layer comprising an o-quinonediazide compound, which comprises developing the plate with an aqueous potassium silicate solution containing a chelating agent selected from the group consisting of amino polycarboxylate acids, organic phosphonic acids and phosphonotricarboxylic acids, said potassium silicate having a molar ratio of $SiO_2/K_2O$ of 1.0 to 2.0 and being present in the developing solution in an amount within the range of 2 to 10 wt.%.

2. A method of claim 1, wherein the chelating agent is added in an amount such that it shows a calcium ion-masking ratio of 50% or more in an aqueous solution having a pH of 12 or more.

3. A method of claim 1, wherein the chelating agent is present in the developing solution in an amount of 0.01 to 1 wt%.

4. A method of claim 1, wherein the chelating agent is present in the developing solution in an amount within the range of 0.02 to 0.1 wt%.

* * * * *